United States Patent [19]

Ideler

[11] Patent Number: 6,111,458

[45] Date of Patent: Aug. 29, 2000

[54] POWER AMPLIFIER AND NUCLEAR SPIN TOMOGRAPHY APPARATUS EMPLOYING SAME

[75] Inventor: Karl-Heinz Ideler, Spardorf, Germany

[73] Assignee: Siemens Aktiengesellschaft, Munich, Germany

[21] Appl. No.: 09/132,549

[22] Filed: Aug. 11, 1998

[30] Foreign Application Priority Data

Aug. 18, 1997 [DE] Germany ............................ 197 35 749

[51] Int. Cl.[7] ................................................. H02M 7/162
[52] U.S. Cl. ........................... 327/588; 327/108; 327/423
[58] Field of Search .................................. 327/108, 110, 327/112, 419, 423, 424, 588

[56] References Cited

U.S. PATENT DOCUMENTS

| | | | |
|---|---|---|---|
| 4,733,342 | 3/1988 | Mueller et al. ......................... | 363/132 |
| 5,280,196 | 1/1994 | Shinozaki ............................... | 327/110 |
| 5,537,015 | 7/1996 | Karwath .................................. | 318/439 |
| 5,701,176 | 12/1997 | Schmitt et al. ......................... | 324/322 |
| 5,939,931 | 8/1999 | Noro ....................................... | 327/424 |

*Primary Examiner*—Toan Tran
*Assistant Examiner*—Quan Tra
*Attorney, Agent, or Firm*—Hill & Simpson

[57] ABSTRACT

A power amplifier has an amplifier module and a pole changer module connected to the amplifier module, and during the operation of the power amplifier an amplifier current flows in a single current direction between the amplifier module and the pole changer module. The pole changer module optionally provides the amplifier current with unchanged current direction or with reversed current direction, as output current of the power amplifier. A nuclear spin tomography apparatus contains at least one such power amplifier. Such a power amplifier exhibits the required efficiency quantitatively and qualitatively, with low outlay and low cost.

19 Claims, 2 Drawing Sheets

POWER AMPLIFIER AND NUCLEAR SPIN TOMOGRAPHY APPARATUS EMPLOYING SAME

BACKGROUND OF THE INVENTION

1. Field of the Invention

The present invention relates to a power amplifier and to a nuclear spin tomography apparatus employing same. The power amplifier can be used in all applications in which high output voltages and currents must be provided, in particular for inductive loads. For example, the amplifier is suited for driving motors and actuators in automation engineering, traffic engineering and plant engineering; however, an application of the amplifier in medical technology as a gradient amplifier in nuclear spin tomography (magnetic resonance imaging) is provided in particular.

2. Description of the Prior Art

A nuclear spin tomography apparatus typically has an orthogonal gradient coil system that surrounds the patient chamber. For each gradient coil, a gradient amplifier is provided, via which the coil is supplied with a precisely regulated current. The precision and dynamic performance of the gradient current are decisive for the image quality. Thus, for example, currents up to 300 A must be maintained with a precision in the mA range, and for the production of sufficiently steep current edges, it must be possible for example to apply voltages up to over 1 kV to the gradient coil. In addition, the output current can have only a small residual ripple.

German OS 40 24 160 discloses a gradient amplifier that has a switched output stage in a bridge circuit with four FET power transistors and four unbiased diodes respectively in parallel thereto. For each direction of the load current, two transistors diagonally opposite one another in the bridge circuit are clocked periodically, and in addition two transistors connected in series in the bridge circuit are driven with opposite phase.

German OS 40 07 566, corresponding to U.S. Pat. No. 5,113,145, discloses a further gradient amplifier in which chokes are inserted between the bridge branches in order to avoid cross-currents. This gradient amplifier further has a specific construction for the reduction of parasitic inductances.

Due to the exacting requirements described above, however, these known gradient amplifiers are very complex and expensive. High costs are caused in particular by the expensive components required for the amplifier, the complicated driving, the considerable structural size and the cooling requirements.

SUMMARY OF THE INVENTION

An object of the present invention is to provide a power amplifier which avoids the problems described above and while has the required efficiency qualitatively and quantitatively, with a low outlay and the lowest possible cost.

The above object is achieved in accordance with the principles of the present invention in a power amplifier, such as a gradient amplifier of a nuclear spin tomography apparatus, having an amplifier module and a pole changer module connected to the amplifier module, wherein an amplifier current flows in a single current direction between the amplifier module and the pole changer module, and wherein the pole changer module can supply the amplifier current as an output current of the power amplifier with a polarity which is the same as the polarity of the current received from the amplifier module, or with a reversed polarity (reversed current direction).

The invention is based on providing an additional pole changer module, in order to optionally provide an amplifier current originating from an amplifier module with the original current direction or with the reversed current direction as an output current. Surprisingly, the overall outlay for the gradient amplifier is thereby reduced, because the use of the pole changer module makes it possible to construct the amplifier module more simply for only one current direction. As stated above, due to the stringent requirements the outlay for the amplifier module is very high, so that the savings that can be achieved compensate the additional outlay for the pole changer module, which is of relatively simple construction.

The amplifier module is preferably constructed as a switching amplifier. In this case, the advantages that can be realized by means of the invention are particularly significant. For example, in the gradient amplifiers known from German OS 40 24 160 and German OS 40 07 566, the switched output stage has two complete amplifier halves, each containing two active and two passive groups of components. For each current direction, only one of these two amplifier halves is active at a time. In accordance with the invention, in which the amplifier module need be constructed only for a single current direction, the outlay for this module, as well as for the allocated driver and auxiliary circuits, can be reduced by half. The amplifier module preferably has a bridge circuit containing only two groups of switching elements and two groups of unbiased diodes.

In the gradient amplifiers known from German OS 40 24 160 and German OS 40 07 566, additional problems occur during switching procedures in the switching bridge. In order to avoid a bridge short-circuit, so-called dead times must be maintained between the respective edges of successive switching pulses. This limits the controllability of the amplifier, since the modulation amplitude is significantly less than 100%. According to German OS 40 07 566, additional components (chokes) are also provided in order to avoid cross-currents.

Surprisingly, when used in a switching amplifier, the invention also solves these problems, since a reversal of the current direction of the amplifier module is no longer required. The amplifier module can be designed so that a bridge short-circuit is not possible, and, correspondingly, no dead times must be maintained and no additional components are required. This is particular effective when two pairs, each of one active component and one passive one, are provided in the amplifier module. These pairs are preferably connected in parallel, and an intermediate circuit voltage across them. MOSFET or IGBT transistors are preferably employed as active components (switching elements) of the amplifier module.

The pole changer module is preferably constructed as a bridge circuit composed of four active control elements, forming two pairs, with the two control elements in each pair being connected in series. An amplifier voltage is preferably across each pair thus formed. A circuit of this sort enables the simple forwarding of the amplifier current in the unmodified or the reversed current direction, by switching two diagonally opposed control elements into a conductive state or into a non-conductive state. These operating states are designated as the switch-through mode and the reverse mode, respectively.

The control elements of the pole changer module can each be an IGBT transistor or a MOSFET transistor as active components. In addition, an unbiased diode can be connected in parallel with the switching path of the transistor. In a MOSFET transistor, this unbiased diode can be formed by the internal diode of the transistor. An integrated control module can contain a control element or several control elements, with the allocated unbiased diodes if warranted. Since the control elements must cause switching only with the relatively low frequency of the output current, IGBT transistors are preferably used due to the low voltage necessary to make them conductive, and their high blocking ability.

A control unit is preferably provided for driving the control and switching elements of the power amplifier. The control unit can be divided into several control modules. The division can be based on the discrete form of the control unit, or can be merely conceptual.

In preferred embodiments, the switch-through and reversed operation of the pole changer module are mutually exclusively. For this purpose, the control elements are preferably driven with binary signals. The changeover between the two operating states preferably takes place as precisely at the zero crossing of the output current as possible. In the ideal case, neither disturbances nor power losses arise. In preferred embodiments, the zero crossing is either measured or is determined by the control unit in correspondence with the control signals of the amplifier module.

In order to avoid possible difficulties associated with driving the amplifier module for very small amplifier current strengths and in the determination of the precise zero crossing time, in preferred embodiments the pole changer module is driven in linear fashion in a predetermined region of small output current strengths (e.g., from +1 A to −1 A). In this linear operation, just as in switch-through or reversed operation, only two control elements of the pole changer module are respectively driven. The driven element, however, are not switched through, but instead act as controllable resistances in order to regulate the output current without distortion, as in a linear output stage. Since the output current is relatively low, only small power losses occur.

The savings achieved by the invention is particularly significant when, instead of a single amplifier module, the power amplifier is formed by several amplifier modules connected in series, to which a single pole changer module is connected. The amplifier modules are preferably driven with chronologically offset pulse-width-modulation signals, in order to achieve an output voltage with very low residual ripple. In a further embodiment, several power amplifiers, each with a separate pole changer module, as well as other constructive units (e.g., boosters), can be connected in series, and can be connected to a gradient coil that serves as a load.

DESCRIPTION OF THE PREFERRED EMBODIMENTS

Figure 1:
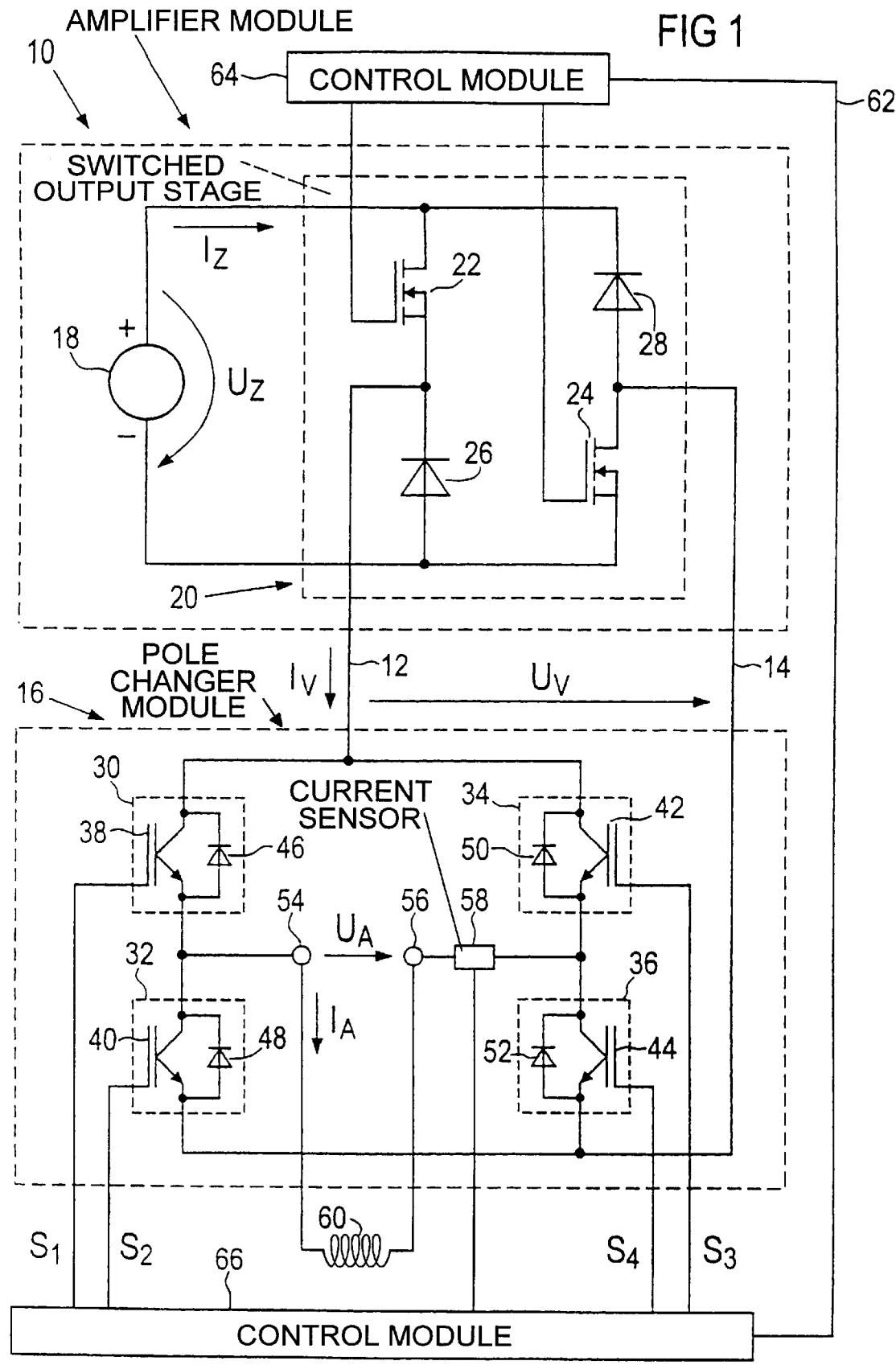
FIG. 1 is a block diagram of a power amplifier constructed in accordance with the principles of the present invention, in the form of a gradient amplifier for a nuclear magnetic resonance tomography apparatus.

The gradient amplifier, shown in FIG. 1, of a nuclear spin tomography apparatus includes an amplifier module 10 that is connected to a pole changer module 16 via connection lines 12, 14. An amplifier voltage $U_v$ is across the pole changer module 16, and an amplifier current $I_v$ flows between the amplifier module 10 and the pole changer module 16.

The amplifier module 10 contains, a voltage source 18 and a switched output stage 20 connected thereto. The voltage source 18 provides a constant intermediate circuit voltage $U_z$ for the switched output stage 20, whereby an intermediate circuit current $I_z$ flows in the intermediate circuit formed by the voltage source 18 and the switched output stage 20.

The switched output stage 20 contains a bridge circuit composed of two switching elements 22, 24 and two unbiased diodes 26, 28. The switching elements 22, 24 are constructed as MOSFET power transistors. The switching element 22 is connected to the positive pole of the voltage source 18 and to the cathode of the unbiased diode 26 and the connection line 12. The anode of the unbiased diode 26 and a terminal of the switching element 24 are connected to the negative pole of the voltage source 18, and the other terminal of the switching element 24 is connected to the anode of the unbiased diode 28 and to the connection line 24. The cathode of the unbiased diode 28 is connected to the positive pole of the voltage source 18. The pole changer module 16 is connected into the bridge cross-branch of the switched output stage 20 via the connection lines 12, 14.

The pole changer module 16 has four control elements 30–36, arranged in a bridge circuit. Each control element 30–36 is constructed as an IGBT module, with an IGBT (insulated gate bipolar transistor) 38–44, and an unbiased diode 46–52 connected in parallel thereto. The two control elements 30, 32, or 34, 36, in each pair are connected in series, and are connected to the connection lines 12, 14. An output terminal 54 is connected to the control elements 30, 32, and an additional output terminal 56 is connected to the control elements 34, 36 via a current sensor 58.

A gradient coil 60 that acts as a load is connected to the gradient amplifier via the output terminals 54, 56. The gradient coils 60 and the current sensor 58 are thus arranged in the bridge cross-branch of the bridge circuit formed from the four control elements 30–36. An output current $I_A$ flows through the gradient coil 60, as a result of an output voltage $U_A$ across the terminals 54, 56.

A control unit is fashioned from two control modules 64, 66, connected with one another via a trunk group 62. The control unit serves for precisely controlling the output current $I_A$, according to a predetermined current curve shape or a target current value. For this purpose, the first control module 64 is connected with the gate terminals of the two switching elements 22, 24, in order to drive these with pulse-width modulation signals. The second control module 66 drives of the gates of the control elements 30–36 with control signals $S_1$–$S_4$. The second control module 66 receives and processes an output current measurement value signal from the current sensor 58, and supplies this signal to the first control module 64 via a line of the trunk group 62, as an actual current value. In addition, the second control module 66 receives a mode signal from the first control module 64 via a further line of the trunk group 62, this signal indicating the operating state to be set for the control elements 30–36.

Figure 2:
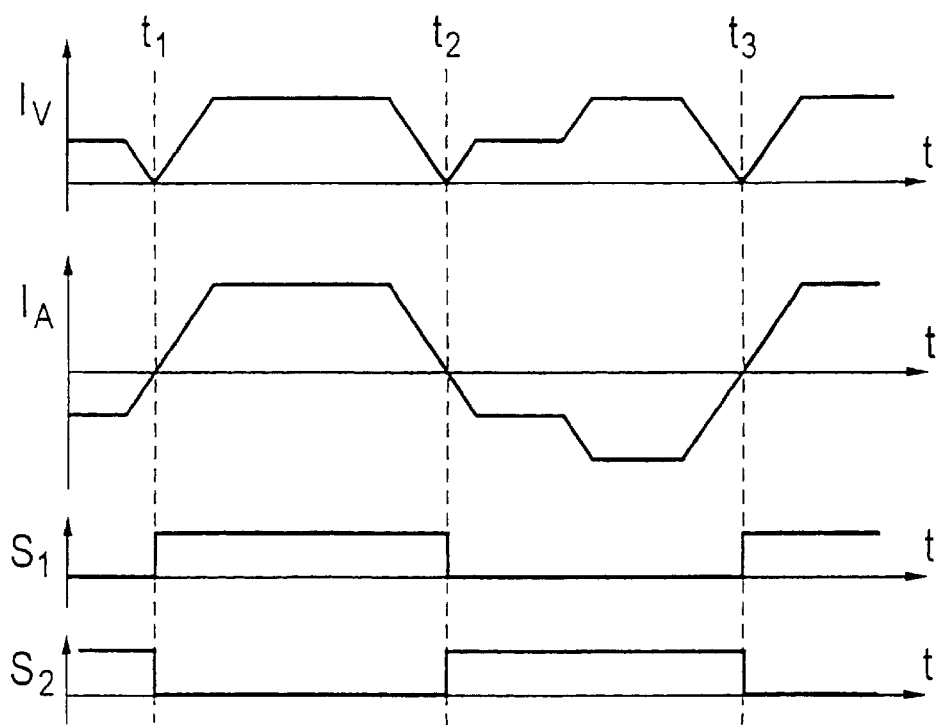
FIG. 2 shows two current curves and two control curves for explaining a first manner of operating the power amplifier shown in FIG. 1.

In FIG. 2, a target curve of the output current $I_A$ flowing through the gradient coil 60 is shown as an example. The output current $I_A$ is negative at the outset, and first decreases (with regard to magnitude) to zero (time $t_1$), and then increases to a positive maximum value (e.g., 300 A). After e.g. 20 $\mu$s the output current $I_A$ falls rapidly to zero (time $t_2$). After this positive half wave of the output current $I_A$ in the time period $t_1$–$t_2$, there follows a negative half wave (time period $t_2$–$t_3$). This current cycle is repeated continuously.

During the operation of the gradient amplifier of FIG. 1, the amplifier current $I_v$ flows between the amplifier module 10 and the pole changer module 16, according to the current curve shown in FIG. 2. The amplifier current $I_v$ is always positive, and thus flows only in a single direction. As can be seen from FIG. 2, the amplifier current $I_v$ always agrees in its magnitude with the output current $I_A$. In the time segment $t_1$–$t_2$, and after the time $t_3$, the amplifier current and the output current have the same sign, while before time $t_1$ and during the time segment $t_2$–$t_3$ the current direction of the output current $I_A$ is reversed in relation to that of the amplifier current $I_v$.

In order to reverse the polarity of the output current $I_A$ in a suitable manner, the control elements 30–36 of the pole changer module 16 are correspondingly driven by the second control module 66. The control signal $S_1$ applied to the control element 30 for this purpose, and the control signal $S_2$ applied to the control element 32, are shown in FIG. 2. A high signal level causes a conductive state of the allocated control element, and a low signal level causes a blocking state. The control signal $S_3$ (control element 34) agrees with the control signal $S_2$, and the control signal $S_4$ (control element 36) agrees with the control signal $S_1$.

As can be seen from FIG. 2, the pole changer module 16 operates in the switch-through mode in the time period $t_1$–$t_2$ and after time $t_3$. The control elements 30 and 36 (control signals $S_1$ and $S_4$) conduct, and the control elements 32 and 34 (control signals $S_2$ and $S_3$) block. In contrast, before time $t_1$ and in the time period $t_2$–$t_3$ the pole changer module 16 operates in the reverse mode. Here, the switching states of the control elements 30–36 are inverted in relation to the switch-through operation.

The operating state or mode to be set is indicated to the second control module 66 by the mode signal produced by the first control module 64. The changeover times $t_1$, $t_2$, $t_3$, . . . between the two operating states are thereby determined by the zero crossings of the output current $I_A$ In order to determine the zero crossings, the output current measurement value signal of the current sensor 58 is evaluated by the second control module 66.

The amplifier module 10 driven by the first control module 64 produces the amplifier voltage $U_v$ in a known way by pulse-width modulation of the intermediate circuit voltage $U_z$, in order to produce the amplifier current $I_v$ shown in FIG. 2. Thus, for example during the constant current maximum in the middle segment of the time period $t_1$–$t_2$, only a relatively low amplifier voltage $U_v$ (which is essentially equal to the output voltage $U_A$) is required to compensate ohmic losses in the gradient coil 60. For this purpose, the switching elements 22, 24 are driven with a relatively low pulse duty factor (e.g., 10%).

During the steep current increase at the beginning of the time period $t_1$–$t_2$, the switching elements 22, 24 are essentially constantly switched through, so that the complete intermediate circuit voltage $U_z$ is across to the gradient coil 60 as the output voltage $U_A$, via the switching elements 22, 24 and the control elements 30, 36. In contrast, during the rapid current decrease at the end of the time period $t_1$–$t_2$ the switching elements are for the most part in a blocking state. The magnetic energy stored in the gradient coil 60 is then fed back into the voltage source 18 via the unbiased diodes 26, 28, whereby the intermediate circuit voltage $U_z$ counteracts the current flow in the gradient coil 60. During the current decrease, the amplifier voltage $U_v$ is negative, but the amplifier current $I_v$ remains positive.

Drive of the amplifier module 10 during the time period $t_2$–$t_3$ takes place correspondingly, whereby the reverse mode of the pole changer module 16, which was activated by the mode signal originating from the first control module 64, is taken into account correspondingly in driving the switching elements 22, 24.

Figure 3:
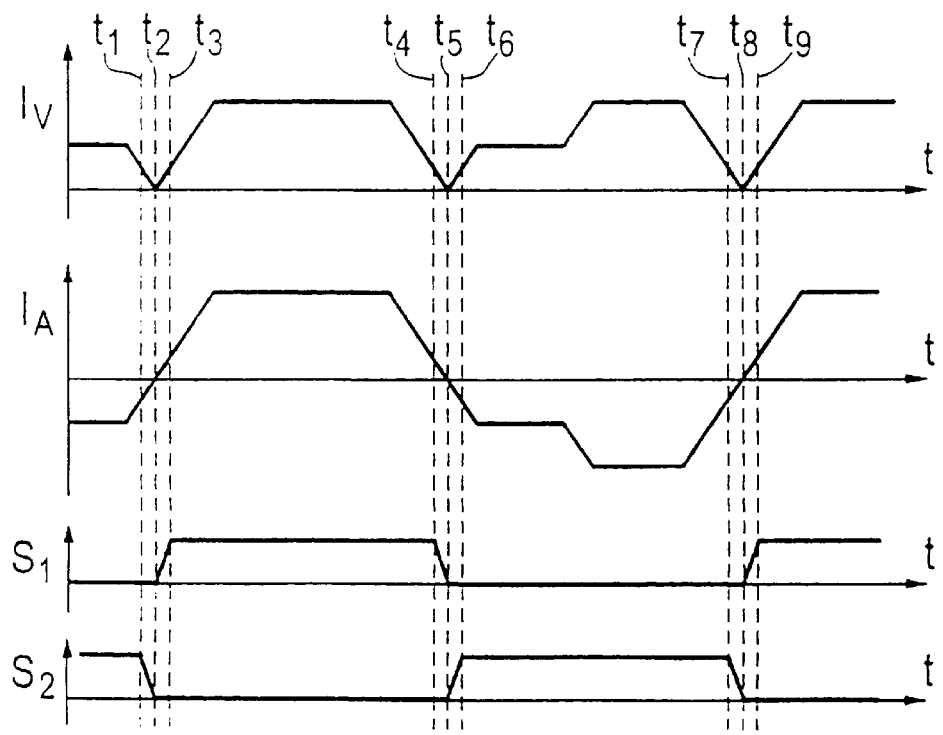
FIG. 3 shows two current curves and two control curves for explaining a second manner of operating the power amplifier shown in FIG. 1.

The alternative construction shown in FIG. 3 is likewise based on the circuit of FIG. 1, but the driving of the circuit elements 22, 24 and of the control elements 30–36 differs from that described previously. The only visible difference from FIG. 2 is that the control signals $S_1$ and $S_2$ are not binary signals, but rather analog signals, with which the control elements 30–36 can be operated by variation of the gate-emitter voltage, as controllable resistances. Again, the control signal $S_3$ is equal to the control signal $S_2$, and the control signal $S_4$ is equal to the control signal $S_1$.

In FIG. 3, the zero crossings of the output current $I_A$ take place at times $t_2$, $t_5$ and $t_8$. During times $t_1$–$t_3$, $t_4$–$t_6$ and $t_7$–$t_8$, the magnitude of the output current $I_A$ lies under a predetermined boundary value, here for example ±1 A. During these time periods, the pole changer module 16 operates in linear operation. That is, though the amplifier current $I_v$ does continue to flow through the gradient coil 60 as the output current $I_A$ of the amplifier, with unchanged current direction (time periods $t_2$–$t_3$, $t_4$–$t_5$ and $t_8$–$t_9$) or with reversed current direction (time periods $t_1$–$t_2$, $t_5$ –$t_6$ and $t_7$–$t_8$), according to the level of the mode signal, this amplifier current $I_v$ is nonetheless controlled in linear fashion by the respective two active control elements 30, 36, or 32, 34, respectively.

For example, in the time period to $t_1$–$t_2$ the control elements 32, 34 are gradually brought from a conductive state into a blocking state (signal $S_2$), so that the output current $I_A$ approximates zero in a linear and distortion-free fashion. In contrast, in the time period $t_2$–$t_3$ the resistance of the control elements 30, 36 is gradually reduced (signal $S_1$), in order to allow the output current $I_A$ to increase gradually. This manner of driving the control elements 30–36, which takes place via the second control module 66, avoids non-linearities and disturbances, which could otherwise occur in the region around the zero crossing, given a pure pulse-width modulation of the switched output stage 20 with an extremely low pulse-duty ratio.

In further variant embodiments, uniform control is provided, for example, by a control computer executing a control program. The two control modules are then regarded only as a conceptual division of the functions of the control unit. In addition, the zero crossing of the output current $I_A$ need not necessarily be measured; rather, it can be determined corresponding to the drive of the switching elements 22, 24.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power amplifier comprising:
   an amplifier module, said amplifier module comprising a voltage source electrically connected to a switched output stage, and said switched output stage comprising a bridge circuit having a first bridge arm containing a first switching element and a first recovery diode and a second bridge arm containing a second switching element and a second recovery diode;

a pole changer module electrically connected to said amplifier module, said amplifier module producing an amplifier current flowing in a single current direction between said amplifier module and said pole changer module; and said pole changer module comprising means for producing an amplifier output current optionally having an amplifier output current direction which is the same as said single current direction or which is reversed with respect to said single current direction.

2. A power amplifier as claimed in claim 1 wherein said amplifier module comprises a voltage source electrically connected to a switched output stage.

3. A power amplifier as claimed in claim 2 wherein said switched output stage comprises a bridge circuit having a first bridge arm containing a first switching element and a first recovery diode and a second bridge arm containing a second switching element and a second recovery diode.

4. A power amplifier as claimed in claim 1 wherein said first switching element and said first recovery diode are connected in series, at a first node, in said first bridge arm and wherein said second switching element and said second recovery diode are connected in series, at a second node, in said second bridge arm, wherein said voltage source is connected across each of said first and second bridge arms for producing an intermediate circuit voltage across said first and second bridge arms, and wherein said pole changer module is connected across said first node and said second node.

5. A power amplifier as claimed in claim 1 wherein said pole changer module comprises a bridge circuit containing four control elements.

6. A power amplifier comprising:

an amplifier module;

a pole changer module electrically connected to said amplifier module, said amplifier module producing an amplifier current flowing in a single current direction between said amplifier module and said pole changer module; and said pole changer module comprising means for producing an amplifier output current optionally having an amplifier output current direction which is the same as said single current direction or which is reversed with respect to said single current direction, said pole changer module comprising a bridge circuit containing four control elements, and said control elements comprising a first pair of control elements connected in series at a first node and a second pair of control elements connected in series at a second node, wherein each of said first pair of control elements and said second pair of control elements is connected across an amplifier voltage produced by said amplifier module, and said pole changer module having two output terminals respectively connected to said first node and said second node.

7. A power amplifier as claimed in claim 1 wherein said amplifier module comprises a voltage source connected to a switched output stage, said switched output stage comprising a bridge circuit containing two switching elements and two unbiased diodes, and said power amplifier further comprising a control module for driving said switching elements for producing said amplifier current in said single current direction by pulse-width modulation.

8. A power amplifier as claimed in claim 7 wherein said control module is a first control module, and wherein said pole changer module comprises a bridge circuit containing four control elements, and said power amplifier further comprising a second control module for driving said control elements of said pole changer module to place the control elements in respective states for providing said output current with the same current direction as said single direction of said amplifier current or with a current direction which is reversed compared to said single current direction.

9. A power amplifier as claimed in claim 8 wherein said output current exhibits a zero crossing, and wherein said second control module comprises means for driving said control elements either in a forward-conducting state or in a reverse-conducting state, with switching between said forward conducting state and said reverse conducting state occurring approximately at said zero crossing of said output current.

10. A power amplifier as claimed in claim 8 wherein said control elements respectively comprise controllable resistances, and wherein said second control module comprises means for linearly operating said control elements to control the respective controllable resistances thereof.

11. A power amplifier as claimed in claim 10 further comprising means for informing said second control module when said output current has a current amplitude between a predetermined positive threshold value and a predetermined negative threshold value, and wherein said second control module comprises means for linearly operating said control elements of said pole changer module when said output current is between said predetermined positive threshold value and said predetermined negative threshold value.

12. A power amplifier as claimed in claim 1 wherein said amplifier module is a first amplifier module, and further comprising a plurality of additional amplifier modules, identical to said first amplifier module, said first amplifier module and said plurality of additional amplifier modules being connected in series and including a last series-connected amplifier module, said last series-connected amplifier module being electrically connected to said pole changer module.

13. A power amplifier as claimed in claim 3 wherein said first switching element and said first recovery diode are connected in series, at a first node, in said first bridge arm and wherein said second switching element and said second recovery diode are connected in series, at a second node, in said second bridge arm, wherein said voltage source is connected across each of said first and second bridge arms for producing an intermediate circuit voltage across said first and second bridge arms, and wherein said pole changer module is connected across said first node and said second node.

14. A power amplifier as claimed in claim 6 wherein said amplifier module comprises a voltage source connected to a switched output stage, said switched output stage comprising a bridge circuit containing two switching elements and two unbiased diodes, and said power amplifier further comprising a control module for driving said switching elements for producing said amplifier current in said single current direction by pulse-width modulation.

15. A power amplifier as claimed in claim 14 wherein said control module is a first control module, and said power amplifier further comprising a second control module for driving said control elements of said pole changer module to place the control elements in respective states for providing said output current with the same current direction as said single direction of said amplifier current or with a current direction which is reversed compared to said single current direction.

16. A power amplifier as claimed in claim 15 wherein said output current exhibits a zero crossing, and wherein said second control module comprises means for driving said control elements either in a forward-conducting state or in a reverse-conducting state, with switching between said forward conducting state and said reverse conducting state occurring approximately at said zero crossing of said output current.

17. A power amplifier as claimed in claim 15 wherein said control elements respectively comprise controllable resistances, and wherein said second control module comprises means for linearly operating said control elements to control the respective controllable resistances thereof.

18. A power amplifier as claimed in claim 17 further comprising means for informing said second control module when said output current has a current amplitude between a predetermined positive threshold value and a predetermined negative threshold value, and wherein said second control module comprises means for linearly operating said control elements of said pole changer module when said output current is between said predetermined positive threshold value and said predetermined negative threshold value.

19. A power amplifier as claimed in claim 6 wherein said amplifier module is a first amplifier module, and further comprising a plurality of additional amplifier modules, identical to said first amplifier module, said first amplifier module and said plurality of additional amplifier modules being connected in series and including a last series-connected amplifier module, said last series-connected amplifier module being electrically connected to said pole changer module.

* * * * *